(12) United States Patent
Kang

(10) Patent No.: US 7,833,870 B2
(45) Date of Patent: Nov. 16, 2010

(54) METHOD FOR FABRICATING SEMICONDUCTOR DEVICE HAVING RECESSED GATE ELECTRODE AND SELF-ALIGNING STACKED CONTACT STRUCTURES

(75) Inventor: Kyung-Doo Kang, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 60 days.

(21) Appl. No.: 12/268,579

(22) Filed: Nov. 11, 2008

(65) Prior Publication Data

US 2009/0170301 A1 Jul. 2, 2009

(30) Foreign Application Priority Data

Jan. 2, 2008 (KR) .................... 10-2008-0000132

(51) Int. Cl.
*H01L 21/336* (2006.01)
*H01L 29/78* (2006.01)

(52) U.S. Cl. ................ 438/300; 438/589; 257/E21.618

(58) Field of Classification Search ................ 438/230, 438/233, 270, 272, 300, 589; 257/E21.618
See application file for complete search history.

(56) References Cited

U.S. PATENT DOCUMENTS

| | | | | |
|---|---|---|---|---|
| 7,071,059 B1 * | 7/2006 | Kim | ............................ | 438/259 |
| 7,205,606 B2 | 4/2007 | Tran | | |
| 2006/0270153 A1 * | 11/2006 | Lee | ............................ | 438/253 |

FOREIGN PATENT DOCUMENTS

| | | | |
|---|---|---|---|
| KR | 10-2005-0089294 | * | 9/2005 |
| KR | 100620655 B | | 8/2006 |
| KR | 1020070017655 A | | 2/2007 |

OTHER PUBLICATIONS

J.Y. Kim et al., The Breakthrough in Data Retention Time of DRAM Using Recess-Channel-Array Transistor (RCAT) for 88nm Feature Size and Beyond. 2003 IEEE, pp. 11-12.*
J.Y. Kim et al., S-RCAT (Sphere-Shaped-Recess-Channel-Array Transistor) Technology for 70nm DRAM Feature Size and Beyond. 2005 IEEE, pp. 34-35.*

* cited by examiner

*Primary Examiner*—Anh D Mai
(74) *Attorney, Agent, or Firm*—Townsend and Townsend and Crew LLP

(57) ABSTRACT

A semiconductor device is fabricated having a stack gate structure where a first gate electrode, a second gate electrode and a gate hard mask are stacked. The stack gate structure secures a contact open margin while reducing a loss of the gate hard mask during a self-aligned contact (SAC) etching process of forming a landing plug contact. An intermediate connection layer is formed in a landing plug contact region between the first gate electrodes. Furthermore, the occurrence of a bridge between a gate and a contact can be prevented while forming the landing plug contact. A conductive material is filled into a gate region including a recess between intermediate connection layers to form the first gate electrode. The second gate electrode and the gate hard mask are formed during a gate-patterning process using a gate mask, even though misalignment occurs between the gate and the contact.

20 Claims, 6 Drawing Sheets

110=21A+20A+100

110=21A+20A+100

110=21A+20A+100

METHOD FOR FABRICATING SEMICONDUCTOR DEVICE HAVING RECESSED GATE ELECTRODE AND SELF-ALIGNING STACKED CONTACT STRUCTURES

CROSS-REFERENCE TO RELATED APPLICATIONS

The present invention claims priority of Korean patent application number 10-2008-0000132, filed on Jan. 2, 2008, which is incorporated by reference in its entirety.

BACKGROUND OF THE INVENTION

The present invention relates to a method for fabricating a semiconductor device, and more particularly, to a method for forming a gate structure of a semiconductor device.

A transistor having a recess gate has been proposed to overcome the limitation that a channel length of the transistor decreases as an integration degree of a semiconductor device increases. The recess gate is a gate provided in a recess formed by etching an active region of a semiconductor device. The recess gate makes it possible to increase a channel length corresponding to a depth of the recess.

Formation of the recess gate, however, requires two masking processes. One is a masking process of forming a recess and the other is a masking process of pattering a gate. Therefore, misalignment may occur between the recess and the gate. Such misalignment between the recess and the gate causes a self-aligned contact (SAC) failure. For example, a bridge phenomenon may occur between a landing plug contact and a gate during a subsequent process of forming the landing plug contact due to the misalignment.

Although a recess gate structure can somewhat overcome the limitation of a decrease in a channel length of a transistor, there are still other limitations caused by a narrow space between gates according to an increase in an integration degree of a semiconductor device.

The narrow space between the gates may cause a contact-not-open phenomenon to take place. In the contact-not-open phenomenon a portion of a substrate to be exposed is not exposed during a subsequent process of forming a landing plug contact. Specifically, a nitride layer, which serves as a barrier during an SAC etching process of forming a landing plug contact, is formed over a gate. As a space between the gates is narrowed, the nitride layer is deposited relatively thickly. Accordingly, the nitride layer deposited on a substrate between the gates is not removed during the SAC etching process, but remains on the substrate, which leads to a contact-not-open phenomenon of a landing plug contact.

To avoid the contact-not-open phenomenon of the landing plug contact, an etching time taken for the SAC etching process to form the landing plug contact may be increased. However, the increase of the SAC etching time may cause a hard mask on a gate to be excessively damaged, resulting in an SAC failure such as a bridge formed between the gate and a subsequently formed contact.

As an alternative to the above method of avoiding the contact-not-open phenomenon of the landing plug contact, the space between the gates may be increased by reducing a linewidth of the gate. However, the reduction in the linewidth of the gate may cause a leaning phenomenon that the gates come into contact with each other because the gates are inclined.

Therefore, with the above-described methods, it is difficult to avoid the contact-not-open phenomenon of the landing plug contact.

SUMMARY OF THE INVENTION

Embodiments of the present invention are directed to providing a method for fabricating a semiconductor device having a stack gate structure where a first gate electrode, a second gate electrode and a gate hard mask are stacked. The stack gate structure secures a contact open margin while reducing a loss of a gate hard mask during a self-aligned contact (SAC) etching process of forming a landing plug contact. An intermediate connection layer is formed in a landing plug contact region between the first gate electrodes.

Embodiments of the present invention are also directed to providing a method for fabricating a semiconductor device, which can prevent the occurrence of a bridge between a gate and a contact during a subsequent process of forming a landing plug contact. A conductive material is filled into a gate region including a recess between intermediate connection layers to form a first gate electrode. A second gate electrode and a gate hard mask are formed during a gate-patterning process using a gate mask, even though misalignment occurs between the gate and the contact.

In accordance with an aspect of the present invention, a method for fabricating a semiconductor device, the method comprises selectively etching a semiconductor substrate to form a recess, forming a first conductive layer filled into the recess, forming a second conductive layer and a first insulation layer over the first conductive layer sequentially, selectively etching the first insulation layer and the second conductive layer to form stack structures in a landing plug contact region of the semiconductor substrate, each of the stack structures including the second conductive layer and the first insulation layer, forming a dielectric spacer on sidewalls of the stack structure, forming a third conductive layer filled between the stack structures to form a first gate electrode including the first or third conductive layer, forming a conductive layer for a second gate electrode and an insulation layer for a gate hard mask over the third conductive layer and the stack structures and patterning the insulation layer for the gate hard mask and the conductive layer for the second gate electrode using a gate mask.

In accordance with another aspect of the present invention, a method for fabricating a semiconductor device, the method comprises forming a recess in a semiconductor substrate, filling the recess with a first conductive layer, forming a pair of stack structures over a landing plug contact region of the semiconductor substrate on opposite sides of the recess, wherein each stack structure comprises a second conductive layer and a first insulation layer, forming a spacer on sidewalls of each stack structure, forming a third conductive layer between the stack structures to form a first gate electrode, wherein the first gate electrode comprises the first conductive layer and the third conductive layer, forming a conductive layer for a second gate electrode and an insulation layer for a gate hard mask over the third conductive layer and the stack structures and patterning the insulation layer for the gate hard mask and the conductive layer for the second gate electrode using a gate mask

DESCRIPTION OF SPECIFIC EMBODIMENTS

Hereinafter, a method for fabricating a semiconductor device in accordance with the present invention will be described in detail with reference to the accompanying drawings.

FIGS. 1A to 1L illustrate a method for fabricating a semiconductor device in accordance with an embodiment of the present invention. In particular, description will be exemplarily made of a method for fabricating a semiconductor device having a recess gate.

Figure 1A:
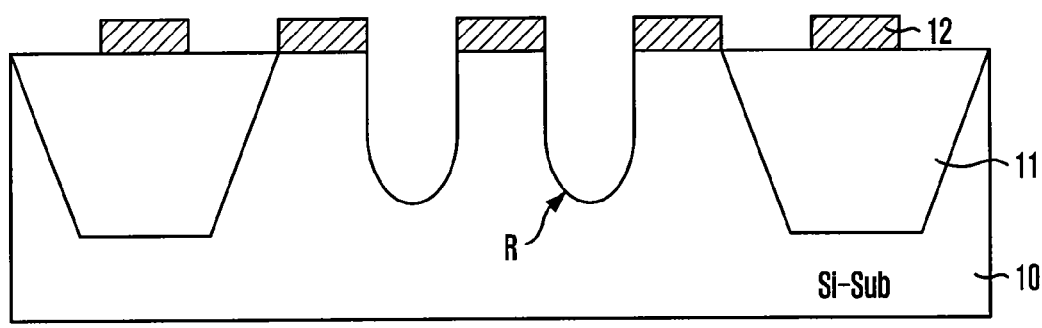
FIGS. 1A to 1L illustrate a method for fabricating a semiconductor device in accordance with an embodiment of the present invention.

Referring to FIG. 1A, a device isolation structure 11 is formed in a semiconductor substrate 10 to define an active region of the semiconductor substrate 10. A first hard mask layer is formed on the semiconductor substrate 10, and the first hard mask layer is then patterned using a mask (not shown) to thereby form a first hard mask pattern 12. The first hard mask pattern 12 may be formed of a nitride. The active region of the semiconductor substrate 10 is etched to a predetermined depth using the first hard mask pattern 12 as an etch barrier to thereby form a recess R.

Figure 1B:
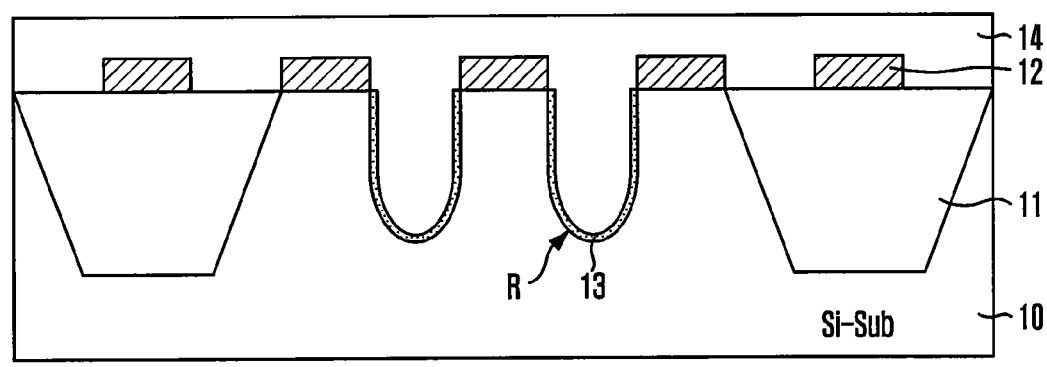

Referring to FIG. 1B, a gate dielectric 13 is formed on a surface of the recess R. A first polysilicon layer 14 for a gate electrode is formed over a resultant structure to a thickness allowing the recess R to be sufficiently filled.

Figure 1C:
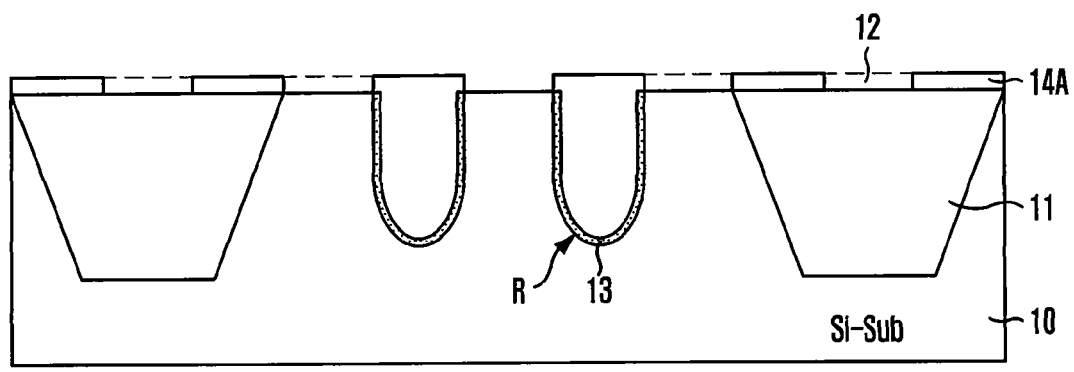

Referring to FIG. 1C, the first polysilicon layer 14 is planarized through, for example, chemical mechanical polishing (CMP) until the first hard mask pattern 12 is exposed, thereby forming a first polysilicon pattern 14A. Subsequently, the exposed first hard mask pattern 12 is selectively removed.

Figure 1D:
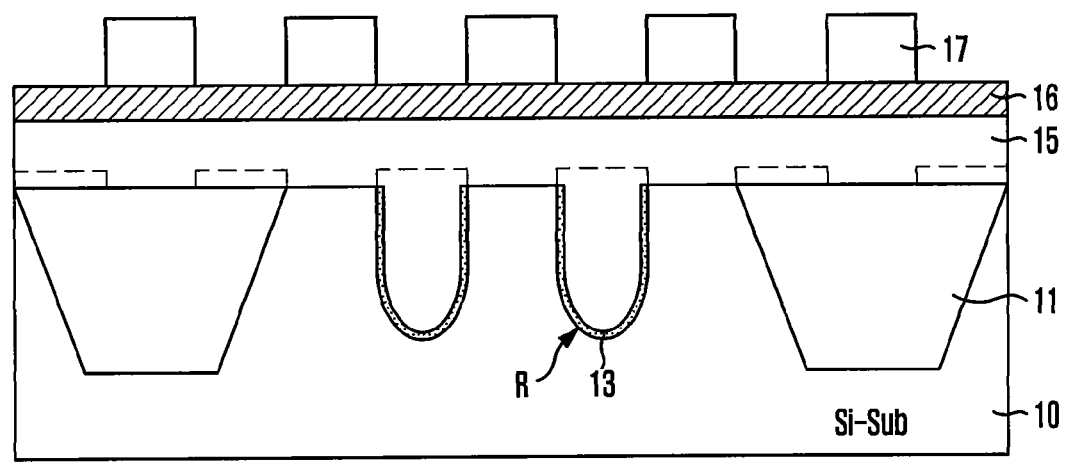

Referring to FIG. 1D, a second polysilicon layer 15 and a second hard mask layer 16 are formed over a resultant structure where the first hard mask pattern 12 is removed. The second hard mask layer 16 may be formed of a nitride. The second polysilicon layer 15 serves as an intermediate connection layer to connect the semiconductor substrate 10 to a landing plug contact to be formed later, and the second hard mask 16 serves as an etch stop layer during a gate-patterning process. A first photoresist pattern 17 is formed on the second hard mask layer 16 to cover a region where a landing plug contact will be formed (hereinafter, referred to as a landing plug contact region).

Figure 1E:
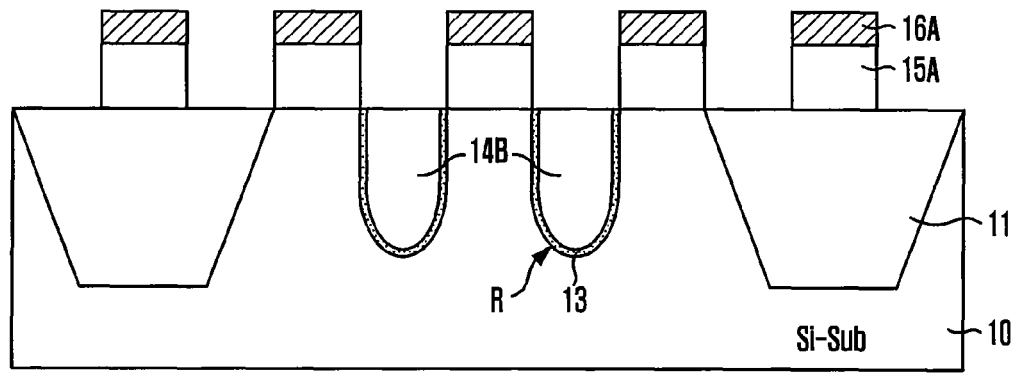

Referring to FIG. 1E, the second hard mask layer 16 and the second polysilicon layer 15 are etched using the first photoresist pattern 17 as an etch barrier to form a stack structure including a second polysilicon pattern 15A and a second hard mask pattern 16A in the landing plug contact region of the semiconductor substrate 10. A portion of the polysilicon pattern 14A filled in the recess R (i.e., a first polysilicon gate 14B) remains after etching the second hard mask layer 16 and the second polysilicon layer 15.

Figure 1F:
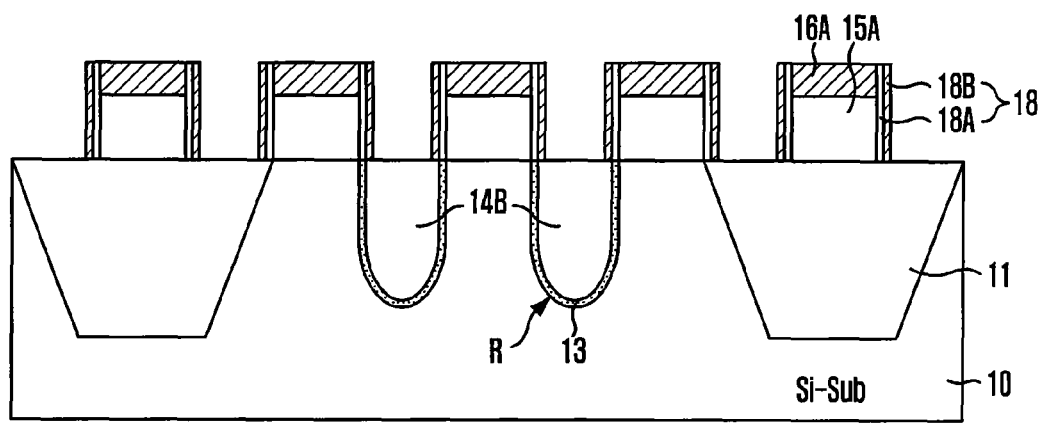

Referring to FIG. 1F, an oxide for a buffer and a nitride for a spacer are sequentially deposited over a resultant structure. Thereafter, a spacer etching is performed to form a spacer 18 including an oxide layer 18A and a nitride layer 18B on sidewalls of the stack structure provided with the second polysilicon pattern 15A and the second hard mask pattern 16A. Resultingly, the first polysilicon gate 14B filled in the recess R is exposed.

Figure 1G:
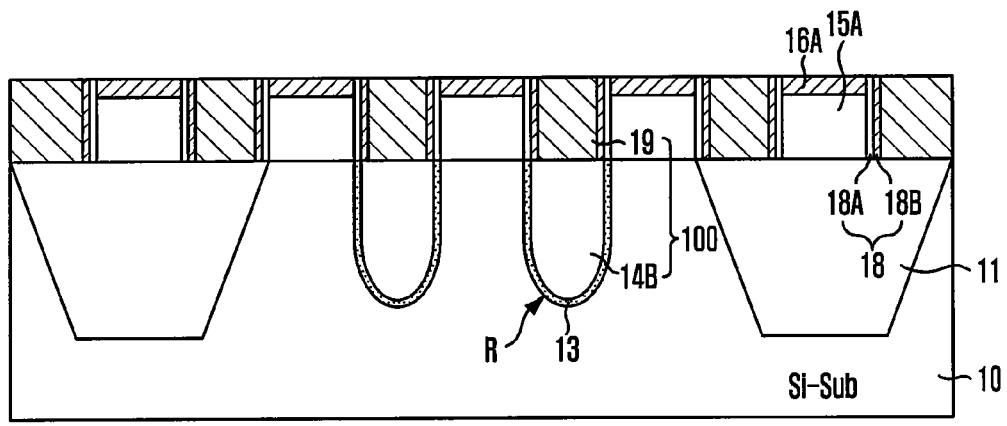

Referring to FIG. 1G, a third polysilicon layer for a gate electrode is formed over a resultant structure. Subsequently, the third polysilicon layer is planarized through, for example, CMP until the second hard mask pattern 16A is exposed, thereby filling a third polysilicon gate 19 between the stack structures. Each stack structure is provided with the second polysilicon pattern 15A and the second hard mask 16A. Resultingly, the third polysilicon gate 19 is formed on the first polysilicon gate 14B filled into the recess R in the active region of the semiconductor substrate 10. Hereinafter, a polysilicon stack structure including the third polysilicon gate 19 on the first polysilicon gate 14B will be referred to as a polysilicon gate electrode 100.

Figure 1H:
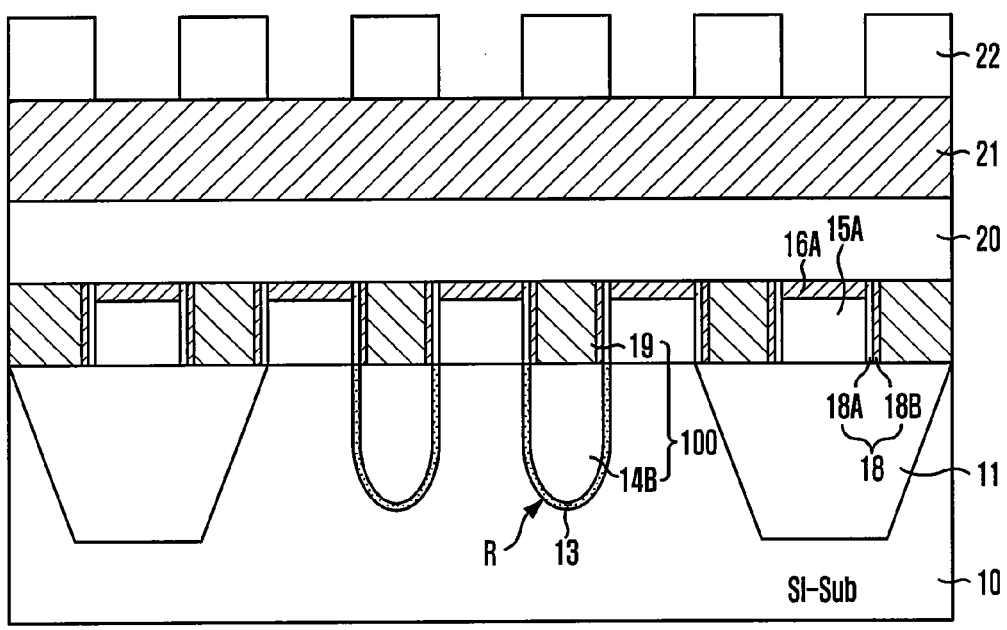

Referring to FIG. 1H, a tungsten layer 20 for a gate electrode and a nitride layer 21 for a gate hard mask are formed over the planarized resultant structure. A second photoresist pattern 22 is then formed on the nitride layer 21 for gate-patterning.

Figure 1I:
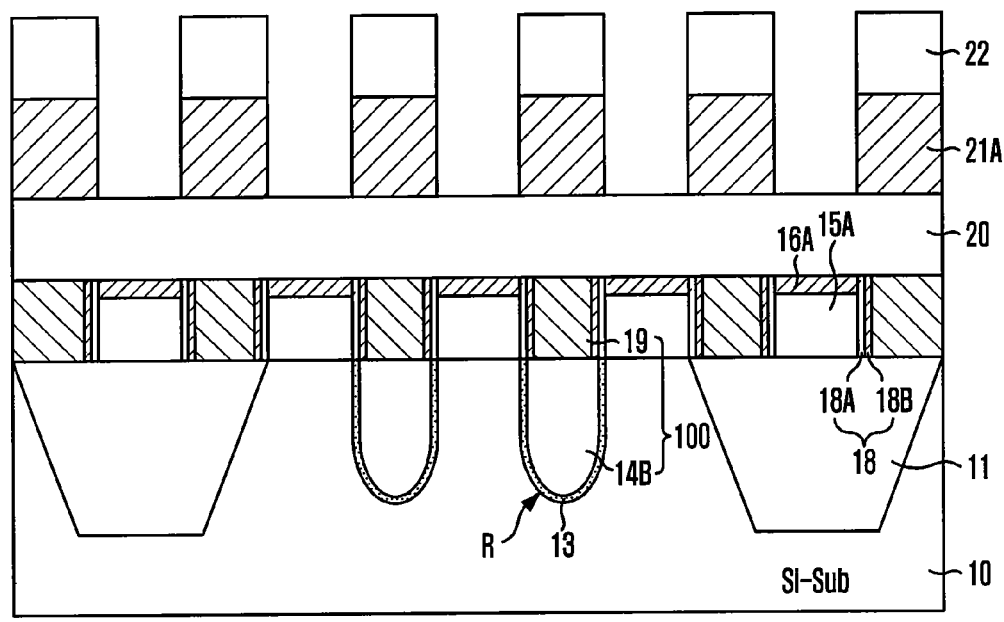
Figure 1J:
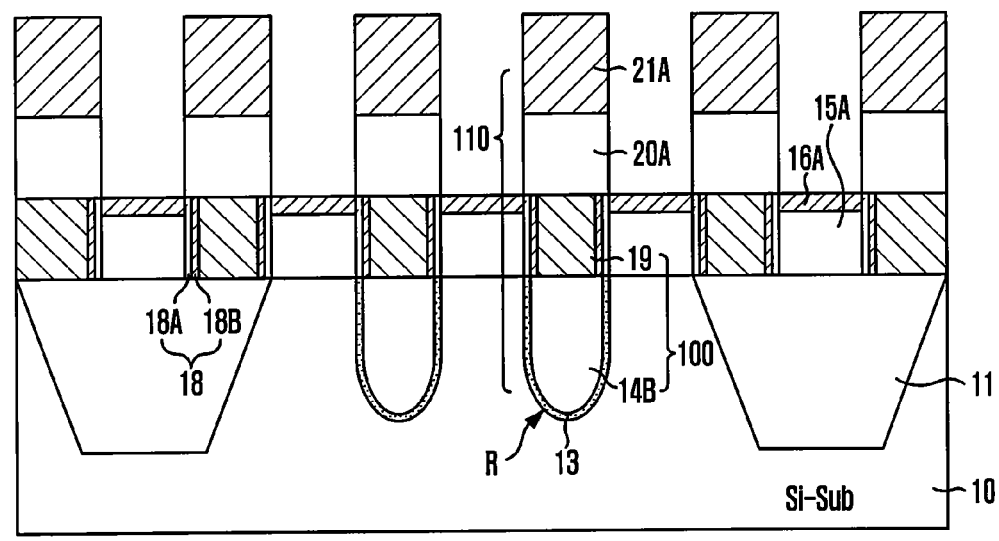

Referring to FIG. 1I, the nitride layer 21 is etched using the second photoresist pattern 22 as an etch barrier to form a gate hard mask 21A. As illustrated in FIG. 1J, the tungsten layer 20 is then etched using at least the gate hard mask 21A as an etch barrier and using the second hard mask pattern 16A as an etch stop layer. Resultingly, a polysilicon gate electrode 100 having a stack structure provided with a gate electrode 20A and the gate hard mask 21A is formed on the polysilicon gate electrode 100.

In this way, the polysilicon gate electrode 100 is formed first, such that the etching process of forming the gate 110 is performed on only the nitride layer 21 and the tungsten layer 20, and the etching process is stopped over the polysilicon gate electrode 100. Consequently, even if misalignment occurs between a gate mask (i.e., the second photoresist pattern 22) and the recess R, the misalignment does not affect the polysilicon gate electrode 100. Accordingly, it is possible to prevent an SAC failure from occurring (e.g., a bridge phenomenon) during a process of forming a landing plug contact.

Figure 1K:
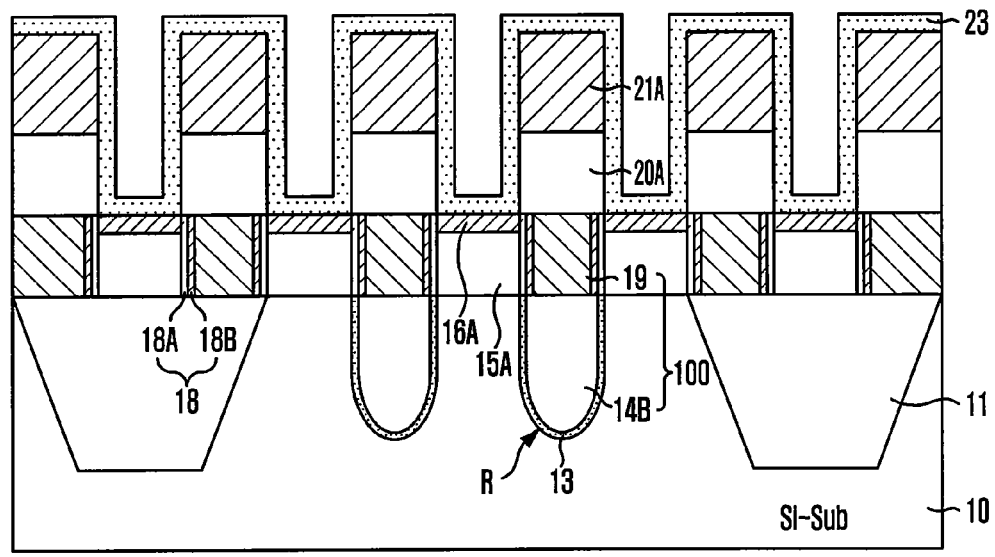

Referring to FIG. 1K, a nitride layer 23 for a gate spacer is formed over the resultant structure including the gate 110.

Figure 1L:
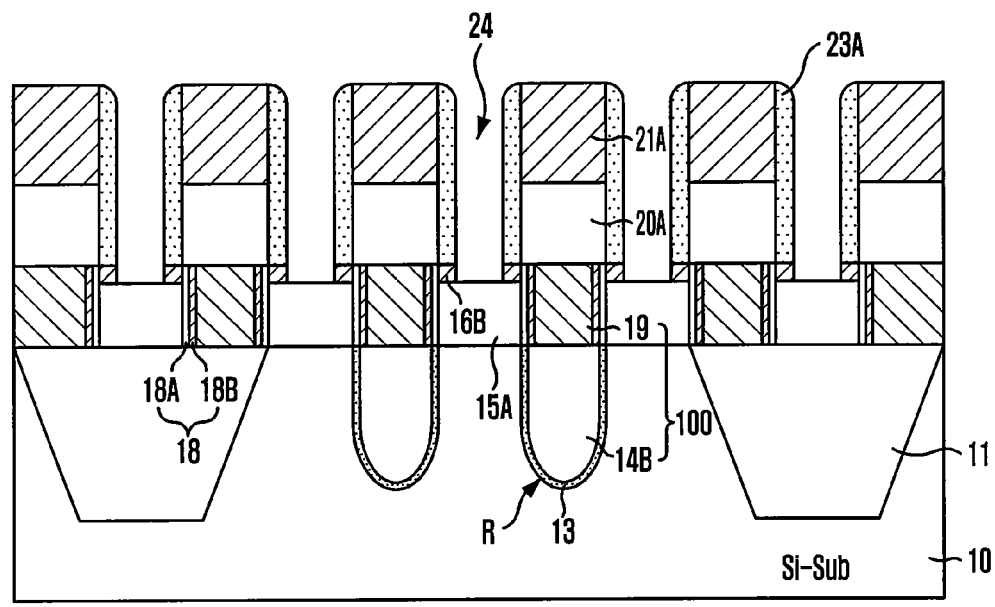

Referring to FIG. 1L, an oxide layer (not shown) is formed over the resultant structure including the nitride layer 23. An SAC etching process is then performed to form a gate spacer 23A and a landing plug contact hole 24 exposing the second polysilicon pattern 15A. Since the SAC etching is performed such that the second polysilicon pattern 15A is exposed, an etch target can be reduced, thus making it possible to avoid a contact-not-open phenomenon of the landing plug contact while reducing the loss of the gate hard mask 21A.

Although not shown, a conductive material fills the landing plug contact 24 during a subsequent process to complete the process of forming the landing plug contact. The second polysilicon pattern 15A is interposed between the semiconductor substrate 10 and the landing plug contact so that it serves as an intermediate connection layer.

The method of forming a semiconductor device in accordance with the present invention can secure a contact open margin while reducing a loss of a gate hard mask during a process of forming a landing plug contact, and particularly, can prevent the occurrence of a bridge between a landing plug contact and a gate even if a misalignment occurs between a recess and a gate mask during a process of forming a recess gate.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a recess in a semiconductor substrate;
    filling the recess with a first conductive layer;
    forming a pair of stack structures over a landing plug contact region of the semiconductor substrate on opposite sides of the recess, wherein each stack structure comprises a second conductive layer and a first insulation layer, wherein the first insulation layer is formed after the filling of the recess with a first conductive layer;

forming a spacer on sidewalls of each stack structure;

forming a third conductive layer between the stack structures to form a first gate electrode, wherein the first gate electrode comprises the first conductive layer and the third conductive layer;

forming a conductive layer for a second gate electrode and an insulation layer for a gate hard mask over the third conductive layer and the stack structures; and patterning the insulation layer for the gate hard mask and the conductive layer for the second gate electrode using a gate mask.

2. The method of claim 1, wherein the first and third conductive layers comprise a polysilicon.

3. The method of claim 1, wherein the second conductive layer comprises a polysilicon.

4. The method of claim 1, wherein the first insulation layer comprises a nitride.

5. The method of claim 1, wherein patterning the insulation layer for the gate hard mask and the conductive layer for the second gate electrode is performed until the first insulation layer is exposed.

6. The method of claim 1, further comprising, after patterning the insulation layer for the gate hard mask and the conductive layer for the second gate electrode:

forming an insulation layer for a gate spacer over the insulation layer for the gate hard mask, the conductive layer for the second gate electrode, and the third conductive layer; and performing a self-aligned contact (SAC) etching process for forming a landing plug contact to expose the second conductive layer.

7. The method of claim 6, wherein the insulation layer for the gate spacer comprises a nitride.

8. A method for fabricating a semiconductor device, the method comprising:

selectively etching a semiconductor substrate to form a recess;

forming a first conductive layer filled into the recess;

forming a second conductive layer and a first insulation layer over the first conductive layer sequentially;

selectively etching the first insulation layer and the second conductive layer to form stack structures in a landing plug contact region of the semiconductor substrate, each of the stack structures including the second conductive layer and the first insulation layer;

forming a dielectric spacer on sidewalls of the stack structure;

forming a third conductive layer filled between the stack structures to form a first gate electrode including the first and third conductive layers;

forming a conductive layer for a second gate electrode and an insulation layer for a gate hard mask over the third conductive layer and the stack structures; and patterning the insulation layer for the gate hard mask and the conductive layer for the second gate electrode using a gate mask.

9. The method of claim 8, wherein the first and third conductive layers comprise a polysilicon.

10. The method of claim 8, wherein the second conductive layer comprises a polysilicon.

11. The method of claim 8, wherein the first insulation layer comprises a nitride.

12. The method of claim 8, wherein patterning the insulation layer for the gate hard mask and the conductive layer for the second gate electrode is performed until the first insulation layer is exposed.

13. The method of claim 8, further comprising, after patterning the insulation layer for the gate hard mask and the conductive layer for the second gate electrode:

forming an insulation layer for a gate spacer over the insulation layer for the gate hard mask, the conductive layer for the second gate electrode, and the third conductive layer; and performing a self-aligned contact (SAC) etching process for forming a landing plug contact to expose the second conductive layer.

14. The method of claim 13, wherein the insulation layer for the gate spacer comprises a nitride.

15. A method for fabricating a semiconductor device, the method comprising:

selectively etching a semiconductor substrate to form a recess;

forming a first conductive material filled into the recess;

forming a first conductive layer over the first conductive material and in contact with an upper surface of the semiconductor substrate;

forming a first insulation layer over the first conductive layer after forming the first conductive layer;

selectively etching the first insulation layer and the first conductive layer to form stack structures in a landing plug contact region of the semiconductor substrate, each of the stack structures including the first conductive layer and the first insulation layer;

forming dielectric spacers on sidewalls of the stack structures;

filling a conductive material between the stack structures to form a first gate electrode;

forming a conductive layer for a second gate electrode and an insulation layer for a gate hard mask over the first gate electrode and the stack structures; and patterning the insulation layer for the gate hard mask and the conductive layer for the second gate electrode using a gate mask.

16. The method of claim 15, wherein the first conductive layer comprises a polysilicon.

17. The method of claim 15, wherein the first insulation layer comprises a nitride.

18. The method of claim 1, wherein patterning the insulation layer for the gate hard mask and the conductive layer for the second gate electrode is performed until the first insulation layer is exposed.

19. The method of claim 1, further comprising, after patterning the insulation layer for the gate hard mask and the conductive layer for the second gate electrode:

forming an insulation layer for a gate spacer over the insulation layer for the gate hard mask, the conductive layer for the second gate electrode and the stack structures; and performing an SAC etching process for forming a landing plug contact to expose the second conductive layer.

20. The method of claim 19, wherein the insulation layer for the gate spacer comprises a nitride.

* * * * *